United States Patent [19]
Kurimoto

[11] Patent Number: 5,338,986
[45] Date of Patent: Aug. 16, 1994

[54] LATCH-UP RESISTANT CMOS OUTPUT CIRCUIT

[75] Inventor: Masahiro Kurimoto, Tokyo, Japan

[73] Assignee: Oki Electric Industry Co., Ltd., Tokyo, Japan

[21] Appl. No.: 62,754

[22] Filed: May 18, 1993

[30] Foreign Application Priority Data

May 28, 1992 [JP] Japan .................. 4-137018

[51] Int. Cl.⁵ ................................ H01L 27/02
[52] U.S. Cl. ...................... 307/303.2; 307/303; 257/372; 257/373
[58] Field of Search ............ 257/372, 386, 401, 409, 257/340, 774, 775, 379, 380, 373; 307/303, 303.1, 303.2

[56] References Cited
U.S. PATENT DOCUMENTS

| | | | |
|---|---|---|---|
| 4,288,804 | 9/1981 | Kikuchi et al. | 257/373 |
| 4,660,067 | 4/1987 | Ebina | 257/373 |
| 4,672,584 | 6/1987 | Tsuji et al. | 257/372 |
| 4,691,217 | 9/1987 | Ueno et al. | 307/303.2 |
| 4,717,836 | 1/1988 | Doyle | 307/303.2 |
| 4,893,164 | 1/1990 | Shirato | 257/372 |
| 5,041,894 | 8/1991 | Reczek et al. | 257/372 |
| 5,105,256 | 4/1992 | Koshimaru | 257/379 |
| 5,146,113 | 9/1992 | Okada | 302/303.2 |
| 5,237,195 | 8/1993 | Sadamatsu | 257/372 |

Primary Examiner—Timothy P. Callahan
Assistant Examiner—Dinh Le
Attorney, Agent, or Firm—Steven M. Rabin

[57] ABSTRACT

A CMOS output circuit including a pMOS transistor and an nMOS transistor connected in series between a power supply voltage and a ground voltage, is formed with a resistive component for reducing occurrence of latch-up. The resistive component is arranged at least one of the sources of the pMOS and nMOS transistors so as to be connected in series with a parasitic bipolar transistor formed between the power supply voltage and the ground voltage through its emitter. The resistive component limits the collector current of the parasitic bipolar transistor at a time that a triggering voltage is applied to an output terminal of the output circuit, so that the parasitic bipolar transistor does not turn on readily, thereby resulting in reduced possibility of occurrence of latch-up.

13 Claims, 3 Drawing Sheets

LATCH-UP RESISTANT CMOS OUTPUT CIRCUIT

CROSS-REFERENCE TO RELATED APPLICATION

This application claims priority benefits under 35 U.S.C §119 of Japanese application Ser. No. 4-137,018, filed May 28th, 1992, the entire disclosure of which is incorporated herein by reference.

BACKGROUND OF THE INVENTION

1. Field of the Invention

This invention relates to a CMOS (Complementary Metal-Oxide Semiconductor) output circuit in a CMOS integrated circuit device having an improved property for preventing latch-up.

2. Description of Related Art

All CMOS circuits have potentially troublesome parasitic elements such as parasitic bipolar transistors and parasitic resistors in its bulk semiconductor body. For example, a pnp parasitic transistor is possible where an n-type substrate, as its base, is formed with a p-well, as its collector, and with a source or a drain of a pMOS transistor, as its emitter. At the same time, an npn parasitic transistor is possible where the p-well as its base is formed with the n-type substrate, as its collector, and with a source or a drain of nMOS transistor, as its emitter. When such a CMOS structure forms an output circuit of an integrated circuit device, a ground voltage Vss and a power supply voltage Vcc are typically supplied to the sources of the nMOS transistor and the pMOS transistor, respectively, and the drains of the nMOS and pMOS transistors are used for an output terminal of the output circuit. If the output terminal incidentally receives a triggering voltage, which is generally higher than the power supply voltage Vcc or lower than the ground voltage Vss, the parasitic transistors begin to conduct since their junctions between base and emitter are forward-biased. Once both parasitic transistors become conducting, a current continues to flow in a direction from the power supply voltage Vcc to the ground voltage Vss without any further triggering voltage to the output terminal. This phenomenon is known as latch-up, and the CMOS circuits are often permanently damaged by the resulting high currents.

SUMMARY OF THE INVENTION

It is an object of the invention to provide a CMOS output circuit in which latch-up does not occur readily even when a triggering voltage is applied to an output terminal thereof.

The foregoing object is accomplished with a CMOS output circuit in which an nMOS transistor and a pMOS transistor are connected in series between a higher voltage and a lower voltage, having a resistive component serially disposed on a side of the source of at least one of the nMOS transistor and the pMOS transistor. The resistive component prevents the parasitic bipolar transistor from turning on when a triggering voltage is applied to the output terminal of the circuit.

In accordance with a preferred embodiment of the invention, the resistive component is formed from a layout of the CMOS output circuit in which a distance between contacts for the source of the nMOS or pMOS transistor and the gate of the nMOS or pMOS transistor is longer than a distance between contacts for the drain of the nMOS or pMOS transistor and the gate of the nMOS or pMOS transistor. In another preferred embodiment of the invention, the resistive component is formed by contacts for the source of the nMOS or pMOS transistor, the number of which is less than the number of the contacts for the drain of nMOS or pMOS transistor.

BRIEF DESCRIPTION OF THE DRAWINGS

The above and other objects and features of the invention are apparent to those skilled in the art from the following preferred embodiments thereof when considered in conjunction with the accompanied drawings, in which.

DETAILED DESCRIPTION OF THE PREFERRED EMBODIMENTS

Figure 1:
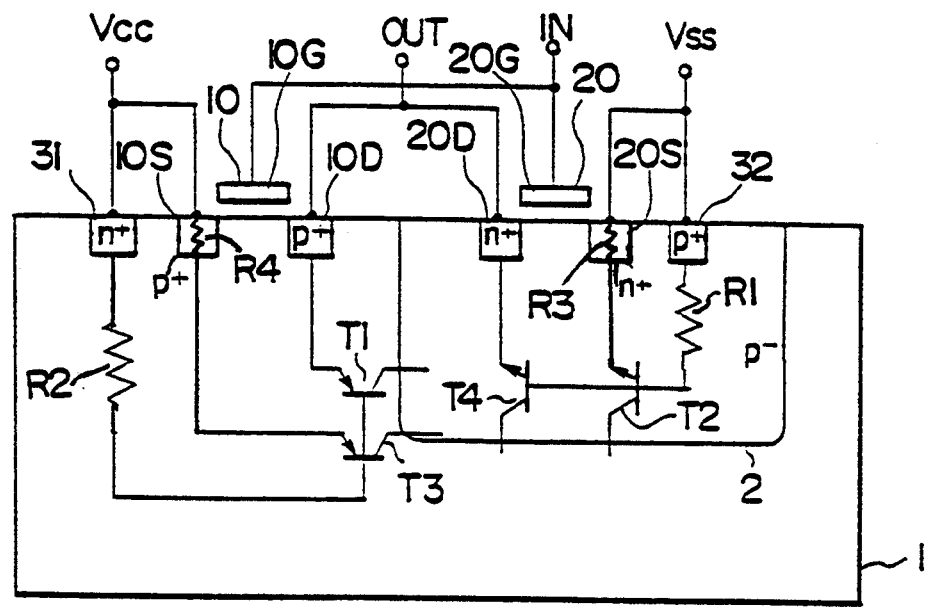
FIG. 1 is an illustration showing cross section of a CMOS output circuit of a preferred embodiment of the invention.

Referring to the drawings in detail, a CMOS output circuit formed in a CMOS integrated circuit device according to a preferred embodiment of the invention is shown. As shown in FIG. 1, the CMOS output circuit is constructed using an n-type substrate 1 formed with a p-well 2. A pMOS transistor 10 is formed at a major surface of the n-type substrate 1, and an nMOS transistor 20 is formed at a major surface of the p-well 2. The pMOS transistor 10 is constituted of a source 10S and a drain 10D, respectively formed of p+ diffusion layers formed at the major surface of the substrate 1, and of a gate 10G formed between the source 10S and the drain 10D. The nMOS transistor 20 is constituted of a source 20S and a drain 20D, respectively formed of n+ diffusion layers formed at the major surface of the p-well 2, and of a gate 20G formed between the source 20S and the drain 20D. The source 10S of the pMOS transistor 10 and the source 20S of the nMOS transistor 20 include parasitic resistors R4, R3, respectively, as resistive components for preventing the CMOS output circuit from latch-up. An n+ diffusion layer 31 is formed adjacently to the source 10S of the pMOS transistor 10, and a p+ diffusion layer 32 is formed adjacently to the source 20S of the nMOS transistor 20.

A power supply voltage Vcc, as a higher voltage, is supplied to the source 10S of the pMOS transistor 10 and the n+ diffusion layer 31. A ground voltage Vss, as a lower voltage, is supplied to the source 20S of the nMOS transistor 20 and the p+ diffusion layer 32. The gate 10G of the pMOS transistor 10 and the gate 20G of the nMOS transistor 20 are commonly connected to an input terminal IN. The drain 10D of the pMOS transistor 10 and the drain 20D of the nMOS transistor 20 are commonly connected to an output terminal OUT, an end of which is formed such as a pin of an integrated circuit device.

Figure 2:
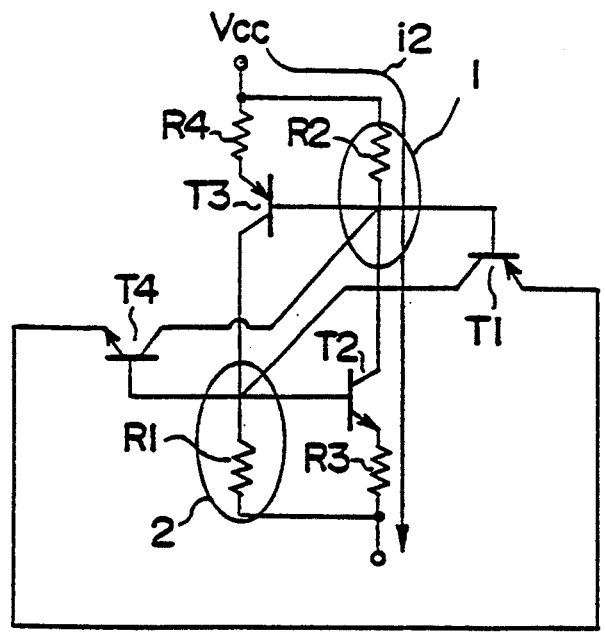
FIG. 2 is a schematic diagram showing parasitic elements of the CMOS output circuit of FIG. 1.

Referring to FIG. 2, parasitic elements along the cross section of the CMOS circuit are shown. In addition to the parasitic resistors R4, R3, parasitic bipolar transistors T1 to T4 and parasitic resistors R1, R2 are formed within the substrate 1 and the p-well 2. A pnp transistor T1 is formed between the drain 10D and the p-well 2, and a pnp transistor T3 is formed between the source 10S and the p-well 2. An npn transistor T2 is formed between the substrate 1 and the source 20S, and an npn transistor T4 is formed between the substrate 1 and the drain 20D. The bases of the transistors T1, T3 are connected to the n+ diffusion layer 31, and the bases of the transistor T2, T4 are connected to the p+ diffusion layer 32. A parasitic resistor R1 formed within the p-well 2 is connected among the collectors of the transistors T1, T3, the bases of the transistors T2, T4, and the ground voltage Vss. A parasitic resistor R2 formed within the substrate 1 is connected among the bases of the transistors T1, T3, the collectors of the transistors T2, T4, and the power supply voltage Vcc. In FIG. 2, reference number i2 denotes a collector current of the transistor T2. The parasitic resistor R3 is disposed at the emitter of the npn transistor T2 so as to be in series with the npn transistor T2. The parasitic resistor R4 is disposed at the emitter of the pnp transistor T3 so as to be in series with the pnp transistor T3. These parasitic resistors R3, R4 are formed from structural features such as MOS transistors having a longer distance between the gate and the source, MOS transistors having the less number of contacts for the source, as described below.

In operation, when a triggering voltage higher than the power supply voltage Vcc is applied to the output terminal OUT, the pn junction between the emitter and the base of the transistor T1 becomes forward-biased, and the transistor T1 turns on. Then, the base potential of the transistor T2 is raised by the parasitic resistor R1 formed within the p-well 2, thereby rendering the junction between the emitter and the base of the transistor T2 forward-biased, so that the transistor T2 turns on. While the transistors T1, T2 turn on at a time that a triggering voltage is applied, the parasitic resistor R3 serially connected to the emitter of the transistor T2, limits the collector current i2 flowing through the resistor R2 in the substrate 1, thereby slowing the potential drop of the base of the transistor T3. Since the transistor T3 does not turn on easily, the transistors T2, T3 do not positively feed back into each other, so that latch-up does not occur readily in the CMOS output circuit. Similarly, when a triggering voltage lower than the ground voltage Vss is applied to the output terminal OUT, the parasitic resistor R4, serially connected to the emitter of the transistor T3, limits the collector current flowing through the transistor T3, so that the transistor T2 does not turn on readily, and therefore, latch-up does not occur readily. As a result, in this CMOS output circuit, the occurrence of latch-up is certainly reduced by such a relatively simple structure with the parasitic resistors R3, R4 connected to the emitters of transistors T2, T3, respectively. Those parasitic resistors R3, R4 are formed from structural features as follows.

Figure 3:
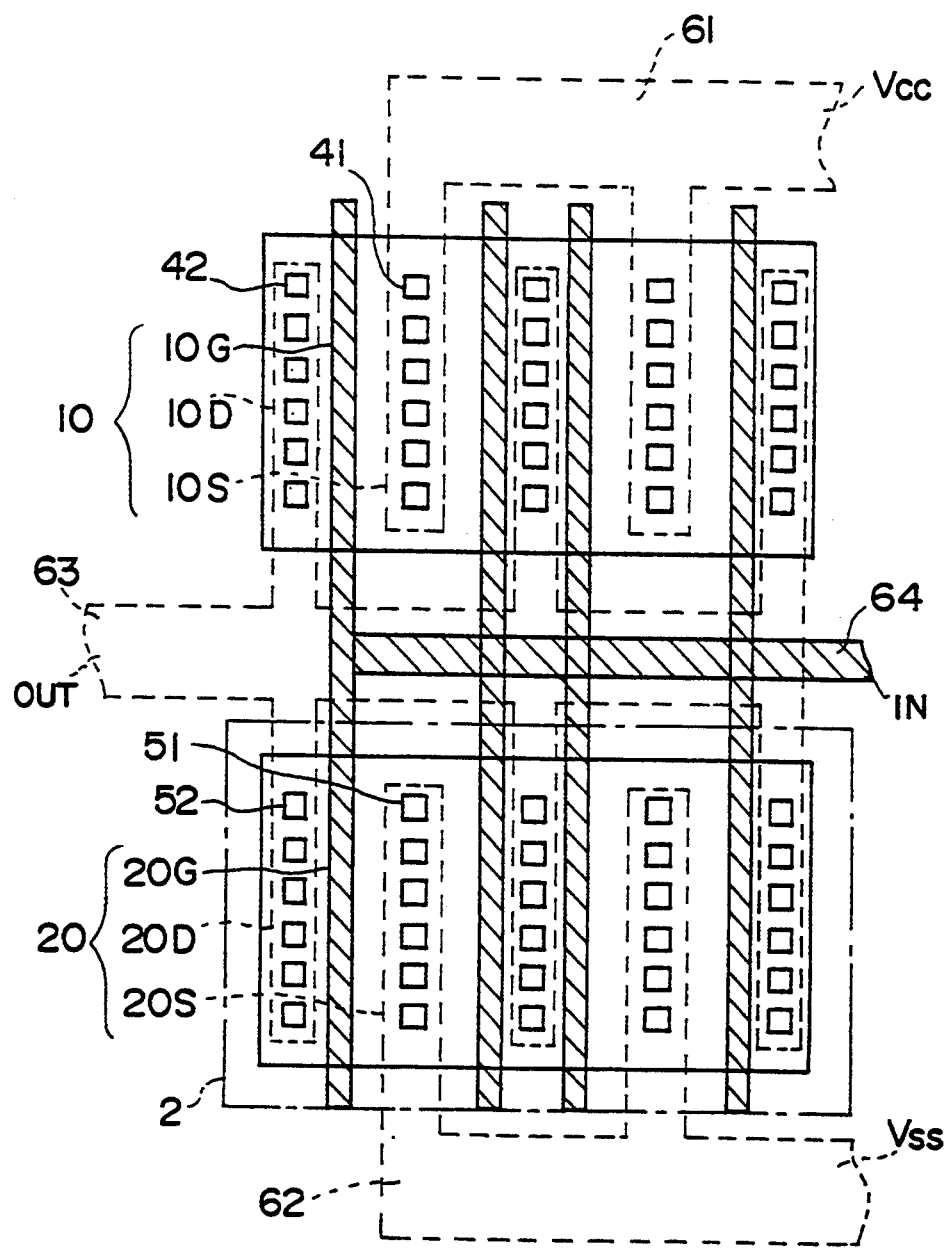
FIG. 3 is a schematic diagram illustrating a layout of the CMOS output circuit of FIG. 1.

Referring to FIG. 3, a layout of the CMOS output circuit is illustrated. In FIG. 3, an electrode 63 for the output terminal OUT and an electrode 64 for the input terminal IN extend horizontally and branch off so as to extend in a vertical direction. The pMOS transistor 10 is disposed on a side of the power supply voltage Vcc with respect of horizontally extending portions of the electrodes 63, 64, and the nMOS transistor 20 is disposed on a side of the ground voltage Vss with respect to the same. The electrode 64 for the input terminal IN serves as a common gate 10G, 20G of these MOS transistors 10, 20 at which the electrode 64 extends vertically. The drain 10D of the pMOS transistor 10 is connected to the electrode 63 for the output terminal OUT through a plurality of contacts 42. The drain 20D of the nMOS transistor 20 is connected to the electrode 63 through a plurality of contacts 52. The source 10S of the pMOS transistor 10 is connected to the electrode 61 for supplying the power supply voltage Vcc through a plurality of contacts 41. The source 20S of the nMOS transistor 20 is connected to the electrode 62 for supplying the power supply voltage Vcc through a plurality of contacts 51. Equal numbers of contacts 41, 42, 51, 52 are arranged in respective lines with a predetermined interval.

As shown in FIG. 3, the arrangement of the contacts 41, 42, 51, 52 is asymmetric with respect to the gate 10G. That is, in this layout of the CMOS output circuit, a distance between each contact 41 and the gate 10G is longer than a distance between each contact 42 and the gate 10G, so as to render the resistive component, or the parasitic resistor R4, high. Similarly, a distance between each contact 51 and the gate 20G is longer than a distance between each contact 52 and the gate 20G, so as to render the resistive component, or the parasitic resistor R3, high. Only by such an asymmetry i.e. a difference between the distances on the layout, the parasitic resistors R3, R4 can be formed at the emitters of the parasitic bipolar transistors T2, T3 in the CMOS output circuit, so that latch-up is certainly reduced.

Figure 4:
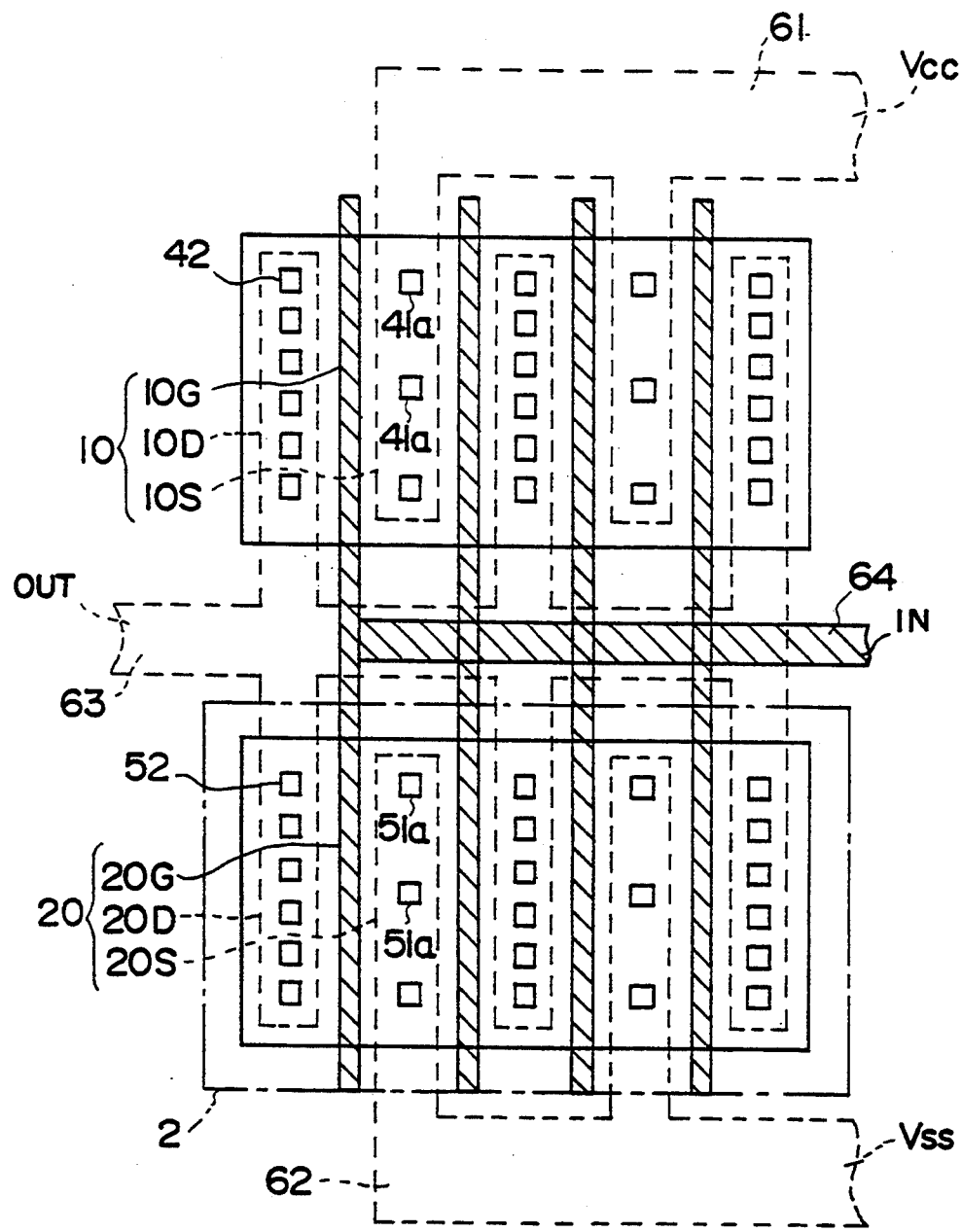
FIG. 4 is a schematic diagram illustrating another layout of the CMOS output circuit of FIG. 1.

Referring to FIG. 4, a modification of the layout of the CMOS output circuit is illustrated. Again, the arrangement of contacts 41a, 42, 51a, 52, is asymmetric with respect to the gate 10G. In this layout, the number of the contacts 41a on a side of the source 10S being less than the number of the contacts 42 on a side of the drain 10D, increases the resistive component at the source 10S. Similarly, the number of the contacts 51a on a side of the source 20S is less than the number of the contacts 52 on a side of the drain 20D to increase the resistive component at the source 20S. According to the layout shown in FIG. 4, the parasitic resistors R3, R4 can be readily formed at the emitters of the parasitic bipolar transistors T2, T3 in the CMOS output circuit, so that latch-up is certainly reduced.

It is to be noted that although the parasitic resistor R3, R4 are formed on respective sides of the sources 10S, 20S of the pMOS and nMOS transistors 10, 20 in the embodiment described above, only either the pMOS transistor 10 or the nMOS transistor 20 may be formed so as to reduce latch-up according to the polarity of the triggering voltage applied to the output terminal OUT. Moreover, although the CMOS integrated circuit is formed on the n-type substrate 1 in this embodiment, it is possible to use a p-type substrate for the CMOS integrated circuit, and the same operation and effect are obtained in the CMOS integrated circuit using the p-type substrate.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A CMOS output circuit for outputting a signal to an output terminal thereof, activated by supplying a higher voltage and a lower voltage, comprising:

a substrate of a first conductivity, having a major surface and being fed with one of said higher and lower voltages;

a well of a second conductivity opposite to said first conductivity, having a major surface, being formed in said substrate, and being fed with the other of said higher and lower voltages;

a first MOS transistor, being formed on said major surface of said well, and having a source of said first conductivity being fed with said other of said higher and lower voltages, and a drain of said first conductivity being connected to said output terminal;

a second MOS transistor being formed on said major surface of said substrate, and having a source of said first conductivity being fed with said one of said higher and lower voltages, and a drain of said first conductivity being connected to said output terminal; and a resistive component provided at least at one of the sources of said first and second MOS transistors so as to be serially connected to a parasitic bipolar transistor whose emitter is formed by said one of the sources, wherein said resistive component is formed from a layout in which a distance between a contact for said source of one of said first and second MOS transistors and a gate of said one of said first and second MOS transistors is longer than a distance between a contact for said drain of said one of said first and second MOS transistors and said gate of said one of said first and second MOS transistors.

2. A CMOS output circuit as set forth in claim 1, wherein said first conductivity is n-type; said second conductivity is p-type; said one of said higher and lower voltages is said higher voltage; and said other of said higher and lower voltages is said lower voltage.

3. A CMOS output circuit as set forth in claim 1, wherein said first conductivity is p-type; said second conductivity is n-type; said one of said higher and lower voltages is said lower voltage; and said other of said higher and lower voltages is said higher voltage.

4. A CMOS output circuit as set forth in claim 1, wherein said resistive component is provided at both of said sources.

5. A CMOS output circuit for outputting a signal to an output terminal thereof, activated by supplying a higher voltage and a lower voltage, comprising:

a substrate of a first conductivity, having a major surface and being fed with one of said higher and lower voltages:

a well of a second conductivity opposite to said first conductivity, having a major surface, being formed in said substrate, and being fed with the other of said higher and lower voltages:

a first MOS transistor, being formed on said major surface of said well, and having a source of said first conductivity being fed with said other of said higher and lower voltages, and a drain of said first conductivity being connected to said output terminal;

a second MOS transistor being formed on said major surface of said substrate, and having a source of said first conductivity being fed with said one of said higher and lower voltages, and a drain of said first conductivity being connected to said output terminal; and a resistive component provided at least at one of the sources of said first and second MOS transistors so as to be serially connected to a parasitic bipolar transistor whose emitter is formed by said one of the sources, wherein said resistive component is formed from a layout of the circuit in which the number of contacts for said source of one of said first and second MOS transistors is less than the number of contacts for said drain of said one of said first and second MOS transistors.

6. A CMOS output circuit for outputting a signal to an output terminal thereof, activated by supplying a higher voltage and a lower voltage, comprising:

a substrate of a first conductivity, having a major surface and being fed with one of said higher and lower voltages;

a well of a second conductivity opposite to said first conductivity, having a major surface, being formed in said substrate, and being fed with the other of said higher and lower voltages;

a first MOS transistor, being formed on said major surface of said well, and having a source of said first conductivity being fed with said other of said higher and lower voltages, and a drain of said first conductivity being connected to said output terminal;

a second MOS transistor being formed on said major surface of said substrate, and having a source of said first conductivity being fed with said one of said higher and lower voltages, and a drain of said first conductivity being connected to said output terminal; and a resistive component formed from a layout in which a distance between a contact for said source of one of said first and second MOS transistors and a gate of said one of said first and second MOS transistors is longer than a distance between a contact for said drain of said one of said first and second MOS transistors and said gate of said one of said first and second MOS transistors.

7. A CMOS output circuit for outputting a signal to an output terminal thereof, activated by supplying a higher voltage and a lower voltage, comprising:

a substrate of a first conductivity, having a major surface and being fed with one of said higher and lower voltages;

a well of a second conductivity opposite to said first conductivity, having a major surface, being formed in said substrate, and being fed with the other of said higher and lower voltages;

a first MOS transistor, being formed on said major surface of said well, and having a source of said first conductivity being fed with said other of said higher and lower voltages, and a drain of said first conductivity being connected to said output terminal;

a second MOS transistor being formed on said major surface of said substrate, and having a source of said first conductivity being fed with said one of said higher and lower voltages, and a drain of said first conductivity being connected to said output terminal; and a resistive component formed from a layout in which the number of contacts for said source of one of said first and second MOS transistors is less than the number of contacts for said drain of said one of said first and second MOS transistors.

8. A CMOS output circuit as set forth in claim 5, wherein said first conductivity is n-type; said second conductivity is p-type; said one of said higher and lower voltages is said higher voltage; and said other of said higher and lower voltages is said lower voltage.

9. A CMOS output circuit as set forth in claim 5, wherein said first conductivity is p-type; said second conductivity is n-type; said one of said higher and lower voltages is said lower voltage; and said other of said higher and lower voltages is said higher voltage.

10. A CMOS output circuit as set forth in claim 5, wherein said resistive component is provided at both of said sources.

11. A CMOS output circuit for outputting a signal, activated by supplying a higher voltage and a lower voltage, comprising:
- a substrate of a first conductivity, having a major surface and being fed with one of the higher and lower voltages;
- a well of a second conductivity opposite to the first conductivity, having a major surface, being formed in said substrate, and being fed with the other of the higher and lower voltages;
- a first MOS transistor formed on said major surface of said well, said first MOS transistor having a source of the first conductivity fed with the other of the higher and lower voltages, a drain of the first conductivity, and a gate;
- a second MOS transistor formed on said major surface of said substrate, said second MOS transistor having a source of the first conductivity fed with the one of the higher and lower voltages, a drain of the first conductivity, and a gate;
- a power supply electrode disposed on the source of one of said first and second MOS transistors;
- an output terminal for receiving the output signal, said output terminal disposed on said drain of said one of said first and second MOS transistors; and
- an arrangement of contacts connecting said power supply electrode to the source of said one of said first and second MOS transistors on one side of the gate of said one of said first and second MOS transistors, and connecting said output terminal to the drain of said one of said first and second MOS transistors on a side of said gate opposite said one side, said arrangement being asymmetrical with respect to said gate of said one of said first and second MOS transistors, the asymmetry providing a parasitic resistance at said source of said one of said first and second MOS transistors, the parasitic resistance serially connected to a parasitic bipolar transistor whose emitter is formed by said source of said one of said first and second MOS transistors.

12. A CMOS output circuit as set forth in claim 11, wherein said contacts include at least one first contact on said one side of said gate of said one of said first and second CMOS transistors, and at least one second contact on the opposite side of said gate of said one of said first and second MOS transistors, and wherein the asymmetry is in distance of the at least one first contact and the at least one second contact from said gate of said one of said first and second MOS transistors, a distance of said at least one first contact from said gate of said one of said first and second MOS transistors being greater than a distance of said at least one second contact from said gate of said one of said first and second MOS transistors.

13. A CMOS output circuit as set forth in claim 11, wherein said contacts include a plurality of first contacts on one side of said gate of said one of said first and second MOS transistors, and a plurality of second contacts on the opposite side of said gate of said one of said first and second MOS transistors, and wherein the asymmetry is in the respective numbers of the first and second contacts, the number of first contacts being less than the number of second contacts.

* * * * *

UNITED STATES PATENT AND TRADEMARK OFFICE
CERTIFICATE OF CORRECTION

PATENT NO. : 5,338,986
DATED : Aug. 16, 1994
INVENTOR(S) : Masahiro KURIMOTO

It is certified that error appears in the above-identified patent and that said Letters Patent is hereby corrected as shown below:

In claim 1, column 5, lines 13 and 15, change "first" to --second--.
In claim 5, column 5, lines 61 and 63, change "first" to --second--.
In claim 6, column 6, lines 25 and 27, change "first" to --second--.
In claim 7, column 6, lines 55 and 57, change "first" to --second--.
In claim 11, column 7, lines 26 and 28, change "first" to --second--.

Signed and Sealed this

First Day of August, 1995

Attest:

BRUCE LEHMAN

Attesting Officer

Commissioner of Patents and Trademarks